(12) United States Patent
Kushida

(10) Patent No.: US 6,774,407 B2
(45) Date of Patent: Aug. 10, 2004

(54) SEMICONDUCTOR DEVICE WITH A SUPPRESSED INCREASE IN TURNED-ON RESISTANCE AND AN IMPROVED TURN-OFF RESPONSE

(75) Inventor: Tomoyoshi Kushida, Seto (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 09/751,452

(22) Filed: Jan. 2, 2001

(65) Prior Publication Data

US 2001/0011745 A1 Aug. 9, 2001

Related U.S. Application Data

(63) Continuation-in-part of application No. 08/942,136, filed on Sep. 29, 1997, now abandoned.

(30) Foreign Application Priority Data

Nov. 13, 1996 (JP) .............................................. 8-301716
Aug. 22, 1997 (JP) .............................................. 9-225946

(51) Int. Cl.⁷ .......................... H01L 29/74; H01L 29/76
(52) U.S. Cl. ....................... 257/131; 257/156; 257/329; 257/617
(58) Field of Search ................................. 257/329, 328, 257/327, 131, 155, 156, 335–339, 342, 378, 491–493, 590, 617, 608–612

(56) References Cited

U.S. PATENT DOCUMENTS 4,752,818 A * 6/1988 Kushida et al. ............. 257/136
5,075,751 A * 12/1991 Tomii et al. ................ 257/136
5,182,626 A * 1/1993 Akiyama et al. ........... 257/142

FOREIGN PATENT DOCUMENTS

JP          64-19771      * 1/1989    ........... H01L/29/78

* cited by examiner

*Primary Examiner*—Ori Nadav
(74) *Attorney, Agent, or Firm*—Pillsbury Winthrop LLP

(57) ABSTRACT

The present invention provides a semiconductor device wherein the turning-off time thereof can be reduced substantially and, at the same time, the turned-on resistance thereof can also be prevented effectively from increasing as well. Lattice defects are distributed at a high concentration in a defect region an area in close proximity to the boundary surface between an n drift region and a $p^+$ substrate. The half-value width of the distribution is set at a value which is large enough for the defect region to include a non-depletion region in the n drift region. However, the defect region is not spread to cover a diffusion layer. In this way, the turning-off time of the semiconductor device can be reduced considerably without being accompanied by an increase in turned-on resistance thereof. In addition, by employing an absorber with an uneven surface, the distribution of lattice defects can be obtained by carrying out radiation of ions at only one time.

11 Claims, 15 Drawing Sheets

SEMICONDUCTOR DEVICE WITH A SUPPRESSED INCREASE IN TURNED-ON RESISTANCE AND AN IMPROVED TURN-OFF RESPONSE

This is a Continuation-in-Part of National Appln. Ser. No. 08/942,136 filed Sep. 29, 1997 now abndoned.

BACKGROUND OF THE INVENTION

1. Field of the Invention

The present invention relates to a semiconductor device carrying out switching control on a current flowing in the thickness direction of the semiconductor device. In particular, the present invention relates to a semiconductor device with a suppressed increase in turned-on resistance and an improved turn-off response.

2. Description of the Prior Art

Traditionally, a so-called isolated-gate bipolar transistor (IGBT), a transistor made by integrating bipolar and field-effect transistors into a single body, is used in applications where a high input impedance and a low output impedance are required.

FIG. 19 is a diagram showing the general structure of an IGBT. As shown in the figure, an ordinary IGBT has an n epitaxial layer 202 on a $p^+$ silicon (Si) substrate 201. In addition, the IGBT also includes an $n^+$ source region 206, a p body region 207 and a $p^+$ body region 209 on the surface of the n epitaxial layer 202. A portion of the n epitaxial layer 202 other than the p body 207 is called an n drift region 202d. On the surface of the n epitaxial layer 202, there is a gate electrode 204 which is insulated from the n epitaxial layer 202 by a gate insulation film 203, and insulation films 205 and 208. The gate electrode 204 veils a portion of the n drift region 202d, a portion of the p body region 207 and a portion of the $n^+$ source region 206 on the surface of the n epitaxial layer 202. In addition, on the front-surface side of the IGBT, there is provided a source electrode 210 which is conductive with respect to the $n^+$ source region 206 and the $p^+$ body region 209. On the back-surface side of the IGBT, on the other hand, there is provided a drain electrode 211 which is conductive with respect to the $p^+$ substrate 201.

In the structure of the IGBT described above, the gate electrode 204, the $n^+$ source region 206, the p body region 207 and the n drift region 202d constitute a field-effect transistor. To be more specific, the p body region 207 is the channel region and the n drift region 202d is the drain region. On the other hand, the $p^+$ body region 209, the n drift region 202d and the $p^+$ substrate 201 form a bipolar (pnp) transistor. To put it in detail, the $p^+$ body region 209 is the collector, the n drift region 202d which also serves as the drain region of the field-effect transistor is the base of the bipolar transistor and the $p^+$ substrate 201 is the emitter.

The main function of the IGBT with the configuration described above is to switch a current flowing from the drain electrode 211 to the source electrode 210 by controlling the voltage applied to the gate electrode 204. To put it in detail, with no voltage applied to the gate electrode 204, even if a voltage is applied to the IGBT so that the drain electrode 211 is set at a potential higher than the source electrode 210, no current flows from the drain electrode 211 to the source electrode 210 because the applied voltage is in a reverse direction with respect to a pn junction between the p body region 207 and the n drift region 202d as well as a pn junction between the $p^+$ body region 209 and the n drift region 202d. If a positive voltage is applied to the gate 204 (with respect to the source electrode 210), however, an n channel is created on the surface of the p body region 207, putting the field-effect transistor in a turned-on state. In this state, electrons flow from the $n^+$ source region 206 to the n drift region 202d by way of the n channel. Accordingly, the concentration of carriers (electrons in this case) in the n drift region 202d increases, reducing the resistance thereof. As a result, a diode formed by the n drift region 202d and the $p^+$ substrate 201 conducts, causing holes to be injected from the $p^+$ substrate 201 to the n drift region 202d. For this reason, the bipolar transistor is turned on, flowing a current from the drain electrode 211 to the source electrode 210 in the thickness (transversal) direction.

Here, when the positive voltage applied to the gate electrode 204 is cut off, the IGBT returns to the turned-off state. In the preceding turned-on state, however, the n drift region 202d was filled with both electrons and holes each at a high concentration. Thus, even when the positive voltage applied to the gate electrode 204 is removed, cutting off the injection of electrons from the $n^+$ source region 206, the concentration of carriers in the n drift region 202d does not decrease immediately. As a result, the transient characteristic of the IGBT at a switch-off operation time indicates that the current does not decrease in magnitude immediately right after the switch-off operation as shown by a dashed line in a graph of FIG. 21. In this way, there is raised a problem of a long turning-off time and a conventional technology has been proposed to solve the problem, that is, to improve the turn-off characteristic of the IGBT.

Basically, according to a proposed means for shortening the turning-off time, a region for distributing recombination centers such as heavy-metal atoms and lattice defects at a high concentration is provided in the IGBT. Such recombination centers cause carriers to mutually extinguish each other so that the concentration of carriers causing the problem described above can be reduced at an early time. According to a technology disclosed in Japanese Published Unexamined Patent Application No. Sho 64-19771, for example, protons are radiated from the back-surface side of the IGBT (or the side of the $p^+$ substrate 201 in the case of the IGBT shown FIG. 19) to distribute lattice defects over a narrow range in close proximity to the $p^+$ substrate 201 inside the n drift region 202d. Refer to a distribution of concentration of lattice defects and impurities in a conventional semiconductor device shown in FIG. 20.

In the case of an IGBT with lattice defects distributed in a narrow range as is the case with the IGBT disclosed in Japanese Published Unexamined Patent Application No. Sho 64-19771, however, the reduction in turning-off time is extremely inadequate. This is because, in regions outside the narrow range, the reduction of the carrier concentration is slow. As a result, in the last portion of the turn-off characteristic, the convergence of the current is late as indicated by a solid line of a graph shown in FIG. 21. In addition, there is raised a problem that, since the lattice-defect distribution region is narrow, the location of the region may vary from device to device due to variations caused by manufacturing processes, greatly affecting the characteristics of the semiconductor device. This problem will arise even if the lattice-defect distribution region is provided in the $p^+$ substrate 201. It should be noted that, instead of radiating ions such as protons as described above, an electron beam can be radiated to distribute lattice defects widely over the entire semiconductor device so as to adequately reduce the turning-off time as is disclosed in Japanese Published Unexamined Patent Application No. Hei 3-272184. In this case, however, lattice defects are also distributed in the portions serving as the field-effect transistor, causing the turned-on resistance to increase.

SUMMARY OF THE INVENTION

The present invention addresses the problems described above; it is thus an object of the present invention to provide a semiconductor device that has an adequately shortened turning-off time without an accompanying increase in turned-on resistance.

In order to achieve the object described above, according to an aspect of the present invention, there is provided a semiconductor device comprising:

- a switching element provided on a surface of a semiconductor layer;
- a substrate at another surface of the semiconductor layer;
- a portion of the semiconductor layer located between the switching element and the substrate having an impurity concentration sufficient enough so that a region adjacent to the substrate is not depleted;
- a defect region provided in a portion of said semiconductor layer includes an entire non depletion layer, wherein the non-depletion layer is not depleted after a switch-off operation;
- a peak of lattice defect concentration within said non-depletion layer, wherein said lattice defect concentration in the non-depletion layer is sufficient to shorten lifetime of carriers and reduce turn-off time; and
- a switching control having a current flowing in a thickness direction of the semiconductor layer when said switching element is turned on and off.

In the semiconductor described above, lattice defects are distributed in an entire portion of a semiconductor layer at a concentration higher than those of other portions and the entire portion is not depleted when the switching element is turned off from an turned-on state in which the switching element is turned on, causing a current to flow in the thickness (transversal) direction of the semiconductor layer. For this reason, in this entire portion, the life times of carriers are shortened. As a result, the concentration of carriers in this entire portion is decreased fast after the switching element is turned off, causing the current to converge to zero early. Since the concentration of lattice defects in the switching element is not in particular higher than those of other portions, on the other hand, the turned-on resistance is low, exhibiting an excellent characteristic of the on operation. Here, in many cases, the distribution of lattice defects in the semiconductor layer shows in actuality a continuously varying value of the concentration as is the case with Gauss' distribution or Lorenz's distribution. In such cases, the range forming a half-value width of the distribution is regarded as the defect region.

According to a desirable aspect of the present invention, there is provided a semiconductor device described above comprising a bipolar transistor with an emitter, a base and a collector thereof laid out in the thickness direction of the semiconductor layer wherein the switching element is a field-effect transistor which is turned on for injecting carriers to the bipolar transistor and the defect region includes an entire portion in the base in close proximity to the emitter which is not depleted after a switch-off operation.

The semiconductor described above is the so-called insulated-gate bipolar transistor (IGBT). In an turned-on state of the IGBT, carriers are injected to the base of the bipolar transistor from the field-effect transistor. Thus, the concentration of carriers in the base is increased, putting the bipolar transistor in an turned-on state and, hence, causing a current to flow. As the field-effect transistor is switched off, a depletion layer is spread from a pn junction between the base and the collector of the bipolar transistor. However, a region in the base in close proximity to a portion of the emitter which is not depleted is included in the defect region. Carriers in this region are extinguished fast, causing the current to converge to zero early. As a result, the IGBT exhibits an excellent turn-off response. Since the concentration of lattice defects in the field-effect transistor is not in particular higher than those of other portions, on the other hand, the turned-on resistance is low, exhibiting an excellent characteristic of the on operation.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

The present invention will become more apparent from a study of the following detailed description of a preferred embodiment with reference to the accompanying diagrams. The embodiment implements a planar-type n-channel IGBT provided by the present invention.

Structure

Semiconductor Layers

Figure 1:
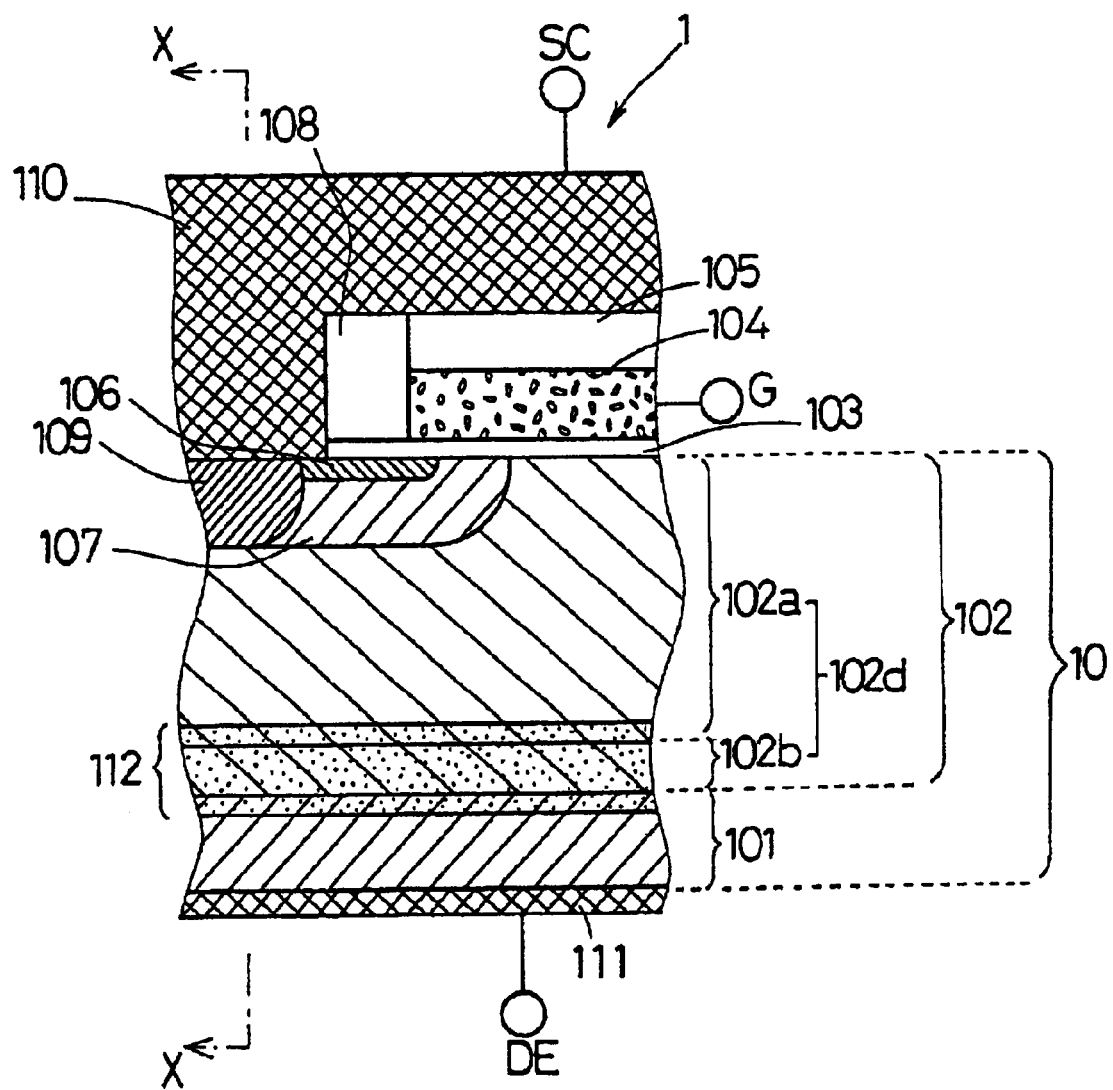
FIG. 1 is a diagram showing a basic structure of a semiconductor device implemented by an embodiment of the present invention.

FIG. 1 is a diagram showing a basic structure of an IGBT 1 implemented by an embodiment of the present invention. As shown in the figure, semiconductor layers 10 comprise a high-concentration p-type $p^+$ substrate 101 and an n epitaxial layer 102 created on the $p^+$ substrate 101. In the semiconductor layers 10, the n epitaxial layer 102 on the upper side of the structure shown in FIG. 1 is referred to as the front-surface side and the $p^+$ substrate 101 on the lower side of the structure shown in FIG. 1 is referred to as the back-surface side. An $n^+$ source region 106, a p body region 107 and a $p^+$ body region 109 are created on the front-surface side of the semiconductor layers 10. The $n^+$ source region 106, the p body region 107 and the $p^+$ body region 109 are diffusion layers resulting from injection of ions to a portion of the n epitaxial layer 102. Portions of the n epitaxial layer 102 other than the p body 107 are called an n drift region 102d.

At a location in close proximity to the boundary surface between the n drift region 102d and the $p^+$ substrate 101, a defect region 112 for distributing lattice defects at a high concentration is created. Most of the defect region 112 is in the n drift region 102d and only part of the defect region 112 is spread to the $p^+$ substrate 101. However, none of the defect region 112 is spread over the diffusion layers such as the p body region 107. The n drift region 102d can be thought of by dividing it into a depletion region 102a and a non-depletion region 102b. The n drift region 102d is divided into the depletion region 102a and the non-depletion region 102b not because of a difference in manufacturing process but because of a difference in operation. To be more specific, after the IGBT 1 has been switched off, a range over which a depletion layer is spread from a pn junction between the p body region 107 and the n drift region 102d as well as a pn junction between the $p^+$ body region 109 and the n drift region 102d is the depletion region 102a while the remaining part is the non-depletion region 102b as will be described later in detail. The non-depletion region 102b is included in the defect region 112.

Figure 2:
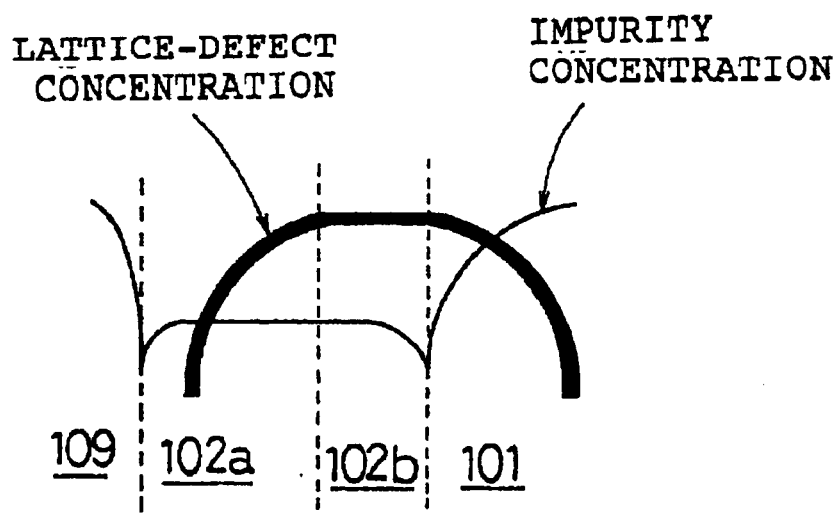
FIG. 2 is a diagram showing a thin solid line representing the concentration of impurities and a thick solid line representing the concentration of lattice defects along an X—X line on the structure of the semiconductor device shown in FIG. 1.

FIG. 2 is a diagram showing a thin solid line representing the concentration of impurities and a thick solid line representing the concentration of lattice defects along an X—X line of the semiconductor layers 10 in the structure of the semiconductor device shown in FIG. 1. As shown in FIG. 2, the concentration of lattice defects changes continuously, showing no clear steps. The range of the defect region 112 shown in FIG. 1 is a range corresponding to a half-value width of the distribution of the lattice-defect concentration.

Furthermore, there may be some difference of concentrations of impurities between non-depletion region 102b and depletion region 102a. That is, non-depletion region 102b can have higher concentration of impurities than that of depletion region 102a. Otherwise, a part of non-depletion region 102b can have higher concentration of impurities than that of other part of non-depletion region 102b and of depletion region 102a. In this case, the part that has higher concentration of impurities is at far side from depletion region 102a.

Electrodes and Isolation Films

The following is description of components such as electrodes and insulation films provided on the front and back surfaces of the semiconductor layers 10 shown in FIG. 1. First of all, on the front-surface side, gate and source electrodes 104 and 110 are provided. The gate electrode 104 is enclosed by a gate insulating film 103 for insulating the gate electrode 104 from the semiconductor layers 10 and insulation films 105 and 108 for insulating the gate electrode 104 from other components. The gate electrode 104 is located on the n epitaxial layer 102 above a portion of the n drift region 102d and a portion of the p body region 107, being further spread to an area above a portion of the $n^+$ source region 106. The gate electrode 104 is electrically insulated from the semiconductor layers 10 by the gate insulating film 103. On the other hand, the source electrode 110 is brought into contact with the $n^+$ source region 106 and the $p^+$ body region 109 so as to form electrically conductive paths to the $n^+$ source region 106 and the $p^+$ body region 109. The gate and source electrodes 104 and 110 are insulated from each other by the insulation films 105 and 108. The gate and source electrodes 104 and 110 are provided with a gate terminal G and a source terminal SC respectively.

On the back-surface side, on the other hand, a drain electrode 111 is provided in contact with the $p^+$ substrate 101 to form an electrically conductive path to the $p^+$ substrate 101. The drain electrode 111 is provided with a drain terminal DE.

Device Configuration

In the structure of the IGBT 1 described above, the $p^+$ body region 109, the n drift region 102d and the $p^+$ substrate 101 form a pnp bipolar transistor. To put it in detail, the $p^+$ body region 109 is the collector of the bipolar transistor, the n drift region 102d and the $p^+$ substrate 101 are the base and the emitter thereof respectively. On the other hand, the gate electrode 104, the $n^+$ source region 106, the p body region 107 and the n drift region 102d constitute an n-channel field-effect transistor. To be more specific, the p body region 107 is the channel region and the n drift region 102d is the drain region. Of course, the $n^+$ source region 106 and the gate electrode 104 are the source and the gate of the n-channel field-effect transistor respectively. In this way, the n drift region 102d serves as the base of the pnp bipolar transistor as well as the drain region of the n-channel field-effect transistor.

Operation

Next, the operation of the IGBT 1 is explained. The main function of the IGBT 1 with the configuration described above is to switch a current flowing from the drain electrode 111 to the source electrode 110 by controlling the voltage applied to the gate electrode 104. That is to say, the IGBT 1 carries out switching control on a current flowing in the thickness (transversal) direction of the semiconductor layers 10.

Off State

First of all, consider a state with no voltage applied to the gate electrode 104. In this state, the field-effect transistor is not turned on, having no effect on how a current flows between the drain and source electrodes 111 and 110. As a result, even if a voltage is applied between the drain and source terminals DE and SC so that the drain terminal DE is set at a potential higher than the source terminal SC in an attempt to flow a current from the drain electrode 111 to the source electrode 110, all but no current will flow because the applied voltage is in a reverse direction with respect to a pn junction between the p body region 107 and the n drift region 102d as well as a pn junction between the p+ body region 109 and the n drift region 102d. That is to say, the bipolar transistor is in a turned-off state.

On State

If a positive voltage (referred to hereafter as a gate voltage) is applied to the gate 104 (with respect to the source electrode 110), however, the following phenomenon occurs. First of all, a field effect of the gate voltage causes an n channel to be created on the surface of the p body region 107 facing the gate electrode 104 and sandwiching the gate insulating film 103 in conjunction with the gate electrode 104, putting the field-effect transistor in a turned-on state. In this state, electrons flow from the n+ source region 106 to the n drift region 102d by way of the n channel.

As a result, the concentration of electrons in both the depletion region 102a and the non-depletion region 102b of the n drift region 102d increases, reducing the resistance of the n drift region 102d. At the same time, the electric potential thereof decreases, causing holes serving as carriers in the p+ substrate 101 to be drawn to the n drift region 102d. As a result, a diode formed by the n drift region 102d and the p+ substrate 101 conducts, raising not only the concentration of electrons but also the concentration of holes in the n drift region 102d. Some of holes getting in the n drift region 102d disappear due to recombination with electrons but some of them further flow into the p+ body region 109 which has a low electric potential. That is to say, the bipolar transistor is turned on, flowing a current from the drain electrode 111 to the source electrode 110 in the thickness (transversal) direction.

That is to say, in the IGBT 1, while the effect like that exhibited by a bipolar transistor to which both electrons and holes contribute is being used as a base in an on operation, on-off control is carried out by using the voltage applied to the insulated gate electrode 104. In this case, the field-effect transistor which is turned on and off directly by the gate voltage plays a role as a switching device for switching the bipolar transistor from a conductive state to a non-conductive state or vice versa. In addition, since the defect region 112 for distributing lattice defects at a high concentration in the semiconductor layers 10 is limited to an area in close proximity to the non-depletion region 102b and not spread to the diffusion layers such as the p body region 107, the turned-on resistance is not high.

Switch Off

When the positive voltage applied to the gate electrode 104 is cut off, the n channel created on the surface of the p body region 107 is extinguished, discontinuing the injection of electrons to the n drift region 102d. As a result, the IGBT 1 returns back to the turned-off state from the turned-on state. A transient operation which occurs in the transition from the turned-on state to the turned-off state is explained as follows.

First of all, in the preceding turned-on state, the n drift region 102d was filled with both electrons and holes each at a high concentration. Thus, when the positive voltage applied to the gate electrode 104 is removed in a switch-off operation, the injection of electrons from the n+ source region 106 is cut off and holes flow out to the p+ body region 109, causing a depletion layer with a very low concentration of carriers to spread from a pn junction on the boundary surface between the p+ body region 109 and the p body region 107. The spreading of the depletion layer extends to the depletion region 102a but not to the non-depletion region 102b. As described above, however, the non-depletion region 102b is included in the defect region 112 and has a high concentration of lattice defects. As a result, the life time of the carrier in the non-depletion region 112b is short. That is to say, electrons and holes mutually extinguish each other early through recombination of them. In addition, as the injection of electrons is discontinued, the flowing-in of holes from the p+ substrate 101 is also cut off, lowering the concentration of carriers due to mutual extinction.

Figure 3:
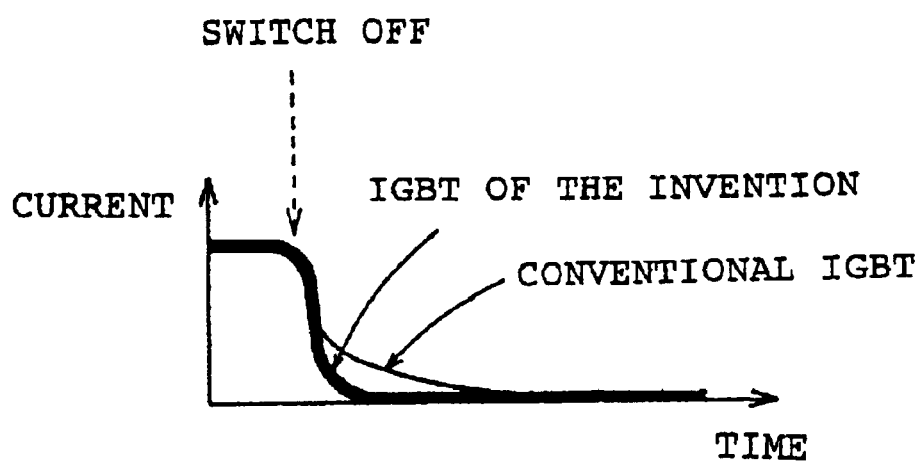
FIG. 3 is a diagram showing a transient characteristic after a switch-off operation of the semiconductor device shown in FIG. 1.

As a result, the concentration of carriers in the entire n drift region 102d decreases early after the switch-off operation. As shown in FIG. 3, the current flowing from the drain electrode 111 to the source electrode 110 converges to zero early after the switch-off operation. That is to say, the turning-off time is short, providing an excellent switch-off operation response characteristic.

Manufacturing Method

Next, a method of manufacturing the IGBT 1 is explained.

Epitaxial Growth

Figure 4:
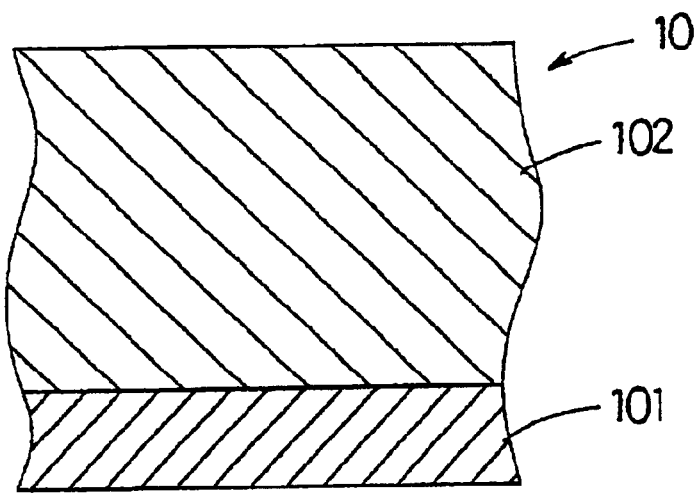
FIG. 4 is a diagram showing semiconductor layers experiencing an epitaxial-growth process.

In the manufacture of the IGBT 1, a high-concentration p-type substrate is used as a silicon substrate. First of all, a low-concentration n-type silicon layer is created on a well washed p+ substrate 101 by an epitaxial-growth process. In this way, semiconductor layers 10 are created as stacked layers of the p+ substrate 101 and the n epitaxial layer 102 as shown in FIG. 4. The p+ substrate 101 serves as an emitter region of the bipolar transistor in the IGBT 1. On the other hand, the n epitaxial layer 102 is a portion used as the n drift region 102d and the diffusion layers.

Creation of the Gate Electrode

Figure 5:
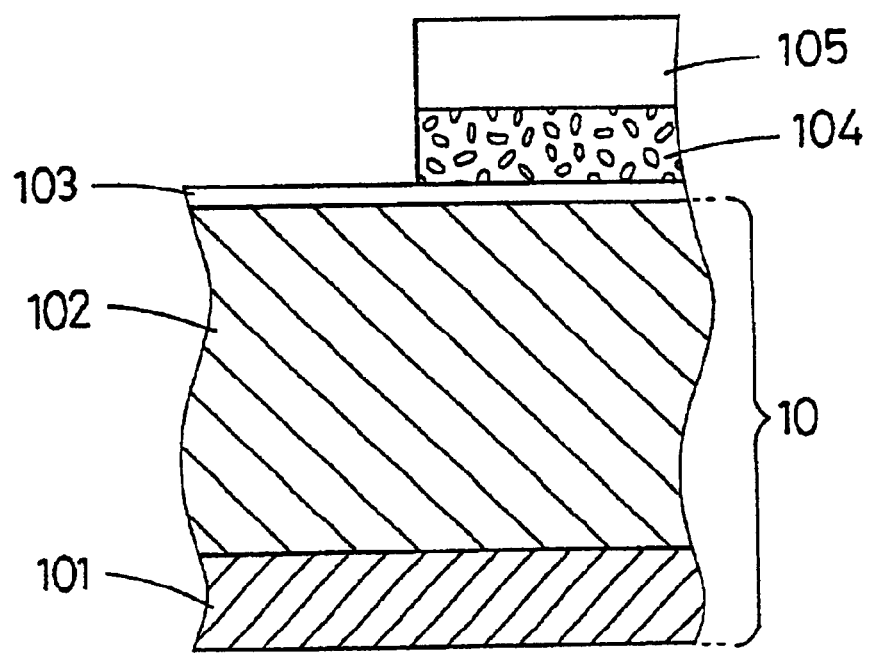
FIG. 5 is a diagram showing the structure of the semiconductor device after the creation and fabrication of a gate electrode.

Subsequently, after a thermal-oxidation film is created on the surface of the n epitaxial layer 102, a poly-crystal silicon layer and a silicon-oxide layer are created sequentially one after another by a CVD method. In order to provide conductivity, the poly-crystal silicon film is doped with an impurity such as phosphor (P). Then, while leaving the thermal-oxidation layer, the poly-crystal silicon layer and the silicon-oxide layer are etched out into a predetermined shape to form the poly-crystal silicon film into a gate electrode 104 as shown in FIG. 5. The gate electrode 104 is insulated from the n epitaxial film 102 by a gate insulating film 105 which is formed from the thermal-oxidation film. It should be noted that an insulation film 105 formed from the silicon-oxide film is used for insulating the gate electrode 104 from the source electrode 110 created later.

Creation of the Diffusion Layers

Figure 6:
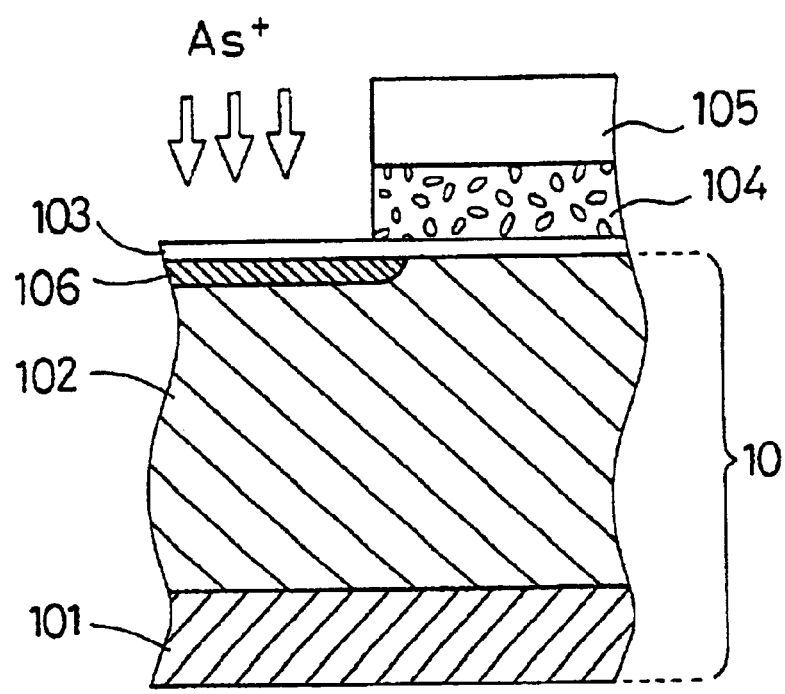
FIG. 6 is a diagram showing a process to create a source region.

Next, diffusion layers are created on portions of the n epitaxial layer 102. A first diffusion layer created is the n+ source region 106. The n+ source region 106 is created by injection of ions of an element having donor properties such as arsenic (AS) from a position above the semiconductor layer 10 which has completed the creation of the gate electrode 104 as shown in FIG. 6. A range in which the injected ions are distributed becomes the n+ source region 106 of the high-concentration n type. Here, since the insulation film 105 serves as a mask for blocking ions, no n+ source region 106 is created in an area beneath the gate electrode 104 except the edge thereof. On the edge, an n+ source region 106 is created by a wraparound of ions in the n epitaxial layer 102. The n+ source region 106 is a portion serving as the source of the field-effect transistor of the IGBT 1.

Figure 7:
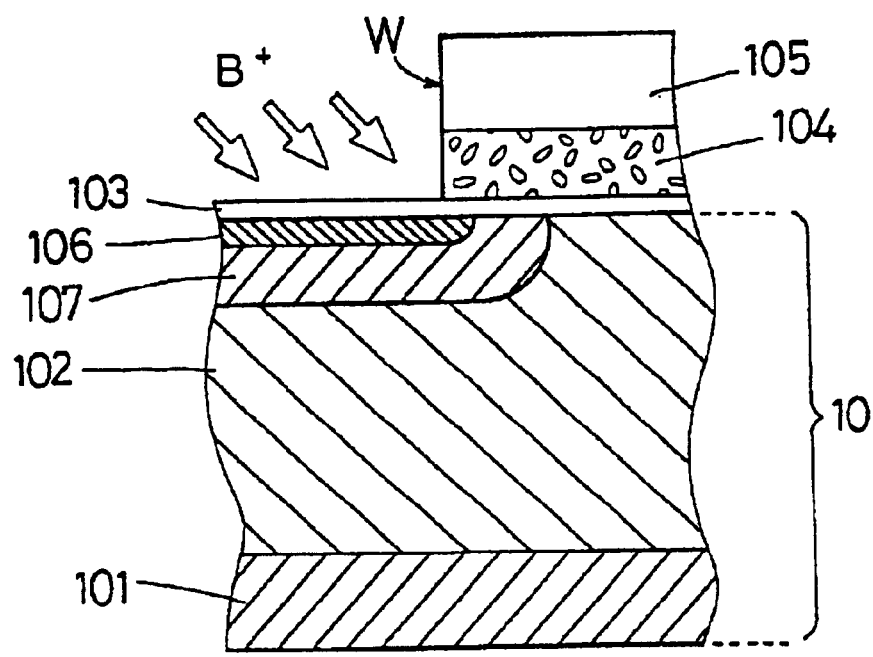
FIG. 7 is a diagram showing a process to create a body region, that is, the channel creating region of a field-effect transistor.

A diffusion layer to be created next is the p body region 107. The p body region 107 is created by injection of ions of an element having acceptor properties such as boron (B) in a slanting direction as shown in FIG. 7 from a position above the semiconductor layer 10 which has completed the creation of the n+ source region 106. At that time, the range in the n epitaxial layer 102 over which ions are injected is made typically about three to five times the range of the injection of ions for creating the n+ source region 106. The larger the range of the injection of ions for creating the p body region 107, the better. However, the larger the range, the larger the amount of energy required for the injection of ions. In actuality, the range of the injection of ions for creating the p body region 107 is therefore made three to five times the range of the injection of ions for creating the n+ source region 106. The dosage of the ion injection is set at a value of an order that does not invert the conduction type of the n+ source region 106 and does not invert the conduction type of the n epitaxial layer 102 outside the n+ source region 106 to the p type. In this way, the range outside the n+ source region 106 over which ions are injected becomes an area of the p conduction type serving as the p body region 107.

Since the p body region 107 is created by injecting ions in a slanting direction and the range of the ion injection is large, the p body region 107 veils the entire circumference of the n+ source region 106. As a result, the n+ source region 106 is not in direct contact with the n drift region 102d or the portion of the n epitaxial layer 102 other than the diffusion layers. The p body region 107 other than that below the n+ source region 106 faces the surface of the n epitaxial layer 102. Another portion of the p body region 107 is exposed to the gate electrode 104, sandwiching the gate insulating film 103 in conjunction with the gate electrode 104. This area is a place at which a channel is created in the field-effect transistor of the IGBT 1.

Figure 8:
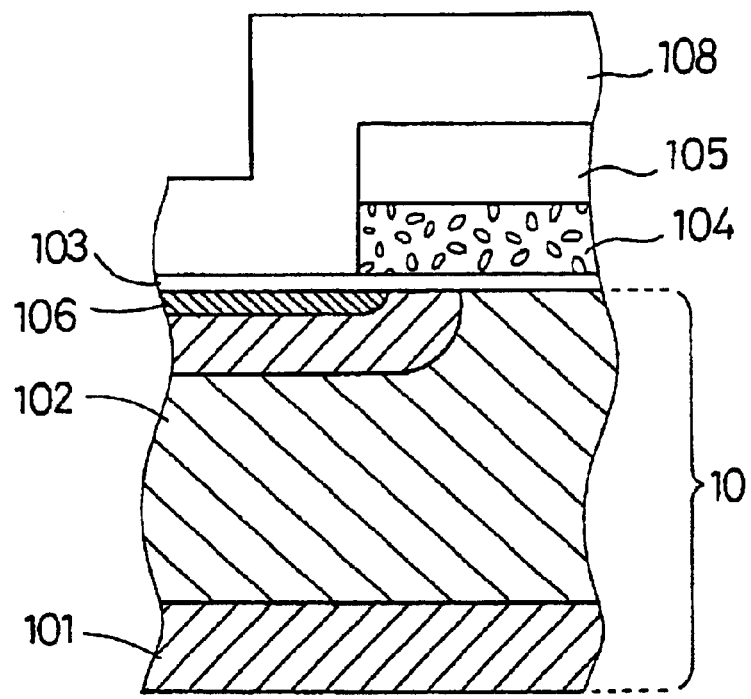
FIG. 8 is a diagram showing the structure of the semiconductor device after an insulation film has been created.
Figure 9:
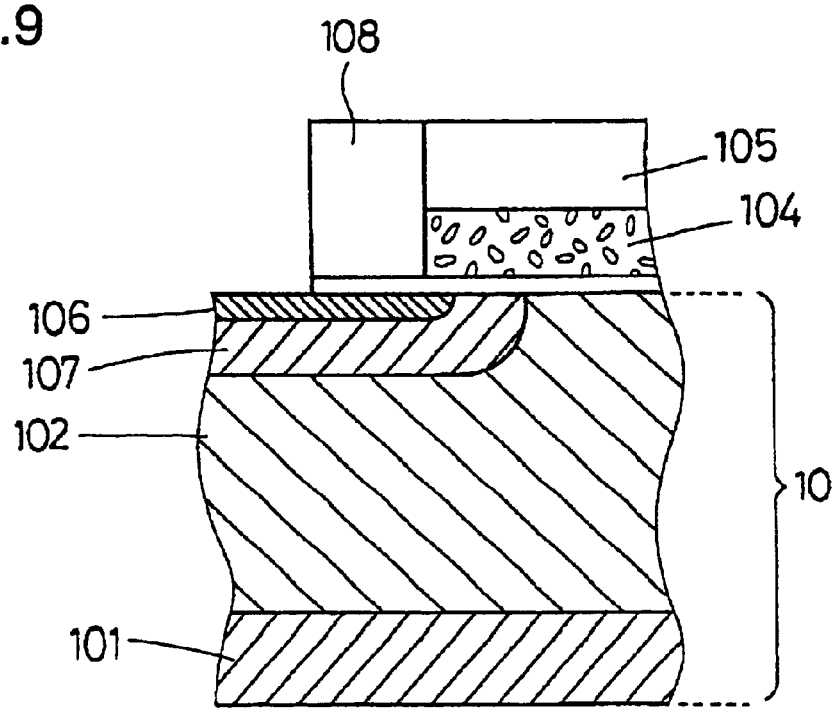
FIG. 9 is a diagram showing the structure of the semiconductor device after a portion of the insulation film created newly in the structure shown in FIG. 8 has been etched out.

Subsequently, the p+ body region 109 is created. In order to create the p+ body region 109, first of all, a silicon-oxide layer 108 is piled by using the CVD method on the semiconductor layer 10 which has completed the creation of the p body region 107. Since the piling process is carried out isotropically, the silicon oxide is also attached to the side walls of the gate electrode 104 and the insulation film 105. It should be noted that the side wall of the insulation film 105 is denoted by notation "W" in FIG. 7. As a result, the piled silicon-oxide film 108 has a shape like the one shown in FIG. 8. Then, the silicon oxide is etched out by using an anisotropic etching method from a position above the silicon-oxide layer 108 till the n epitaxial layer 102 (strictly speaking, the n+ source region 106) is exposed at an area separated away from the gate electrode 104 to result in a structure shown in FIG. 9.

Figure 10:
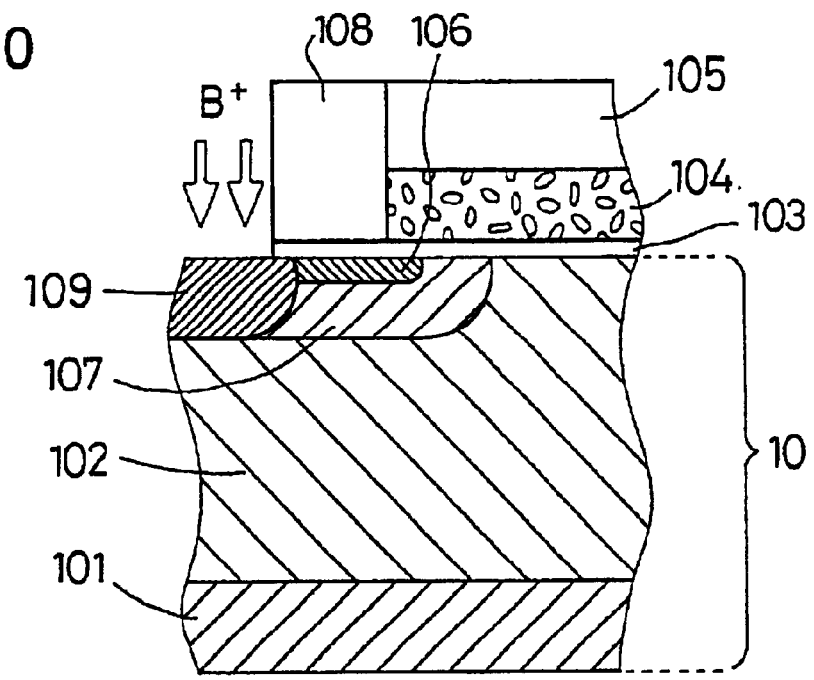
FIG. 10 is a diagram showing a process to create a high-concentration body region, that is, the collector region of a bipolar transistor.

Then, ions of an element having acceptor properties such as boron (B) are injected as shown in FIG. 10. At that time, the range in the n epitaxial layer 102 over which ions are injected is made about the same order as the range of the ion injection for creating the p body region 107. The dosage of the ion injection is set at a value of an order that does not invert the conduction type of the portion serving as the n+ source region 106. In this way, a portion of the p body region 107 and a portion of the n+ source region 106 become the p+ body region 109 having a high impurity concentration. The created p+ body region 109 faces the surface of the n epitaxial layer 102. The bottom of the p+ body region 109 is in direct contact with the n drift region 102d with no p body region 107 existing between them. This portion serves as the collector region of the bipolar transistor of the IGBT 1.

Creation of the Source Electrode

Figure 11:
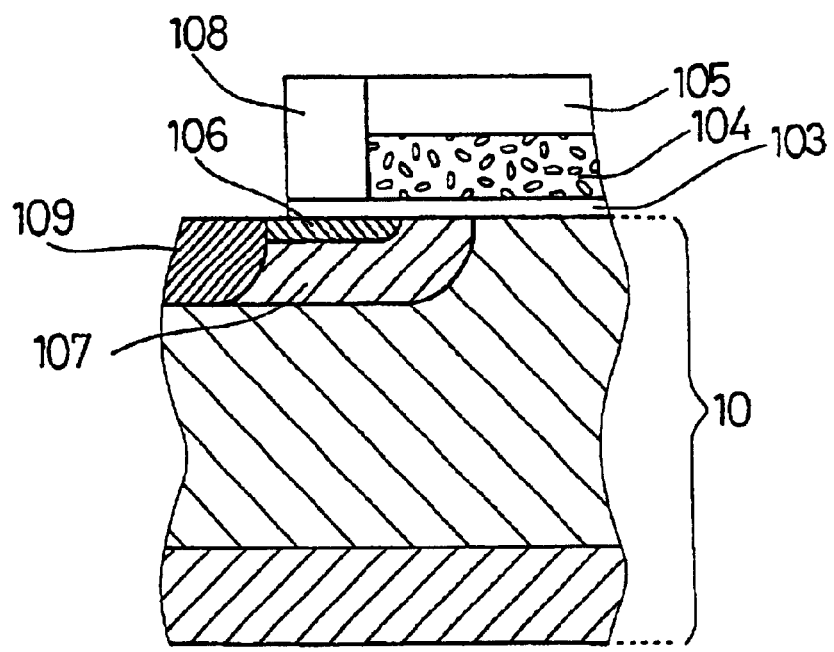
FIG. 11 is a diagram showing the structure of the semiconductor device after portions of the insulation films have been etched out.
Figure 12:
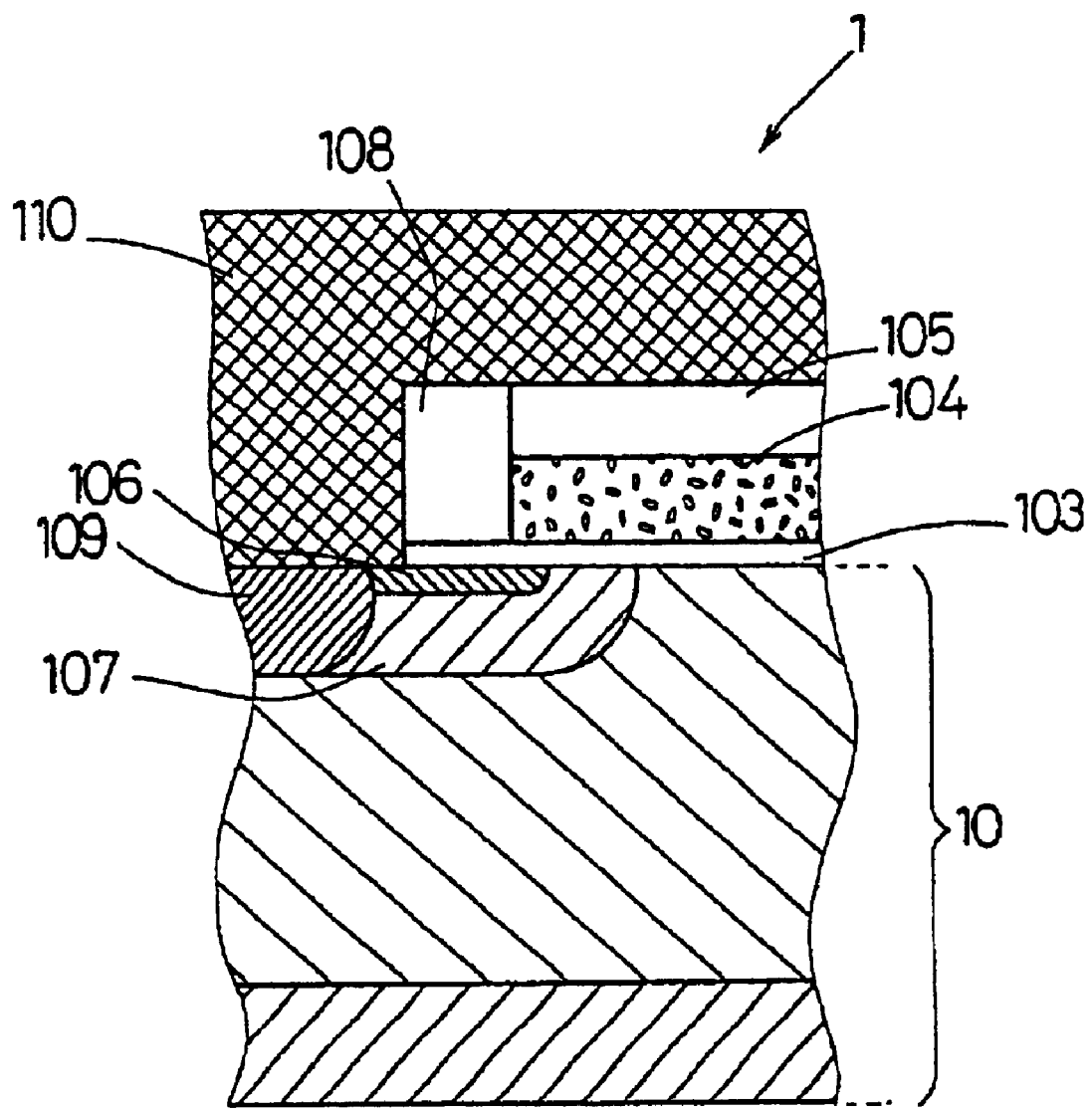
FIG. 12 is a diagram showing the structure of the semiconductor device after the source electrode has been created.

Then, the insulation films 105 and 108 are partially etched out in order to expose a portion of the n+ source region 106 and to adjust the thickness of the insulation film 108 as shown in FIG. 11. For these reasons, the insulation films 105 and 108 are partially etched by using an isotropic etching method such as the wet etching technique. Subsequently, a metal such as aluminum (Al) is piled by using a sputtering method to result in a structure shown in FIG. 12. As shown in the figure, the source electrode 110 is created in contact with both the p+ body region 109 and the n+ source region 106. It should be noted that, in the structure shown in FIG. 12, the gate electrode 104 is insulated from other components by the insulation films 103, 105 and 108.

Creation of the Defect Region

Figure 13:
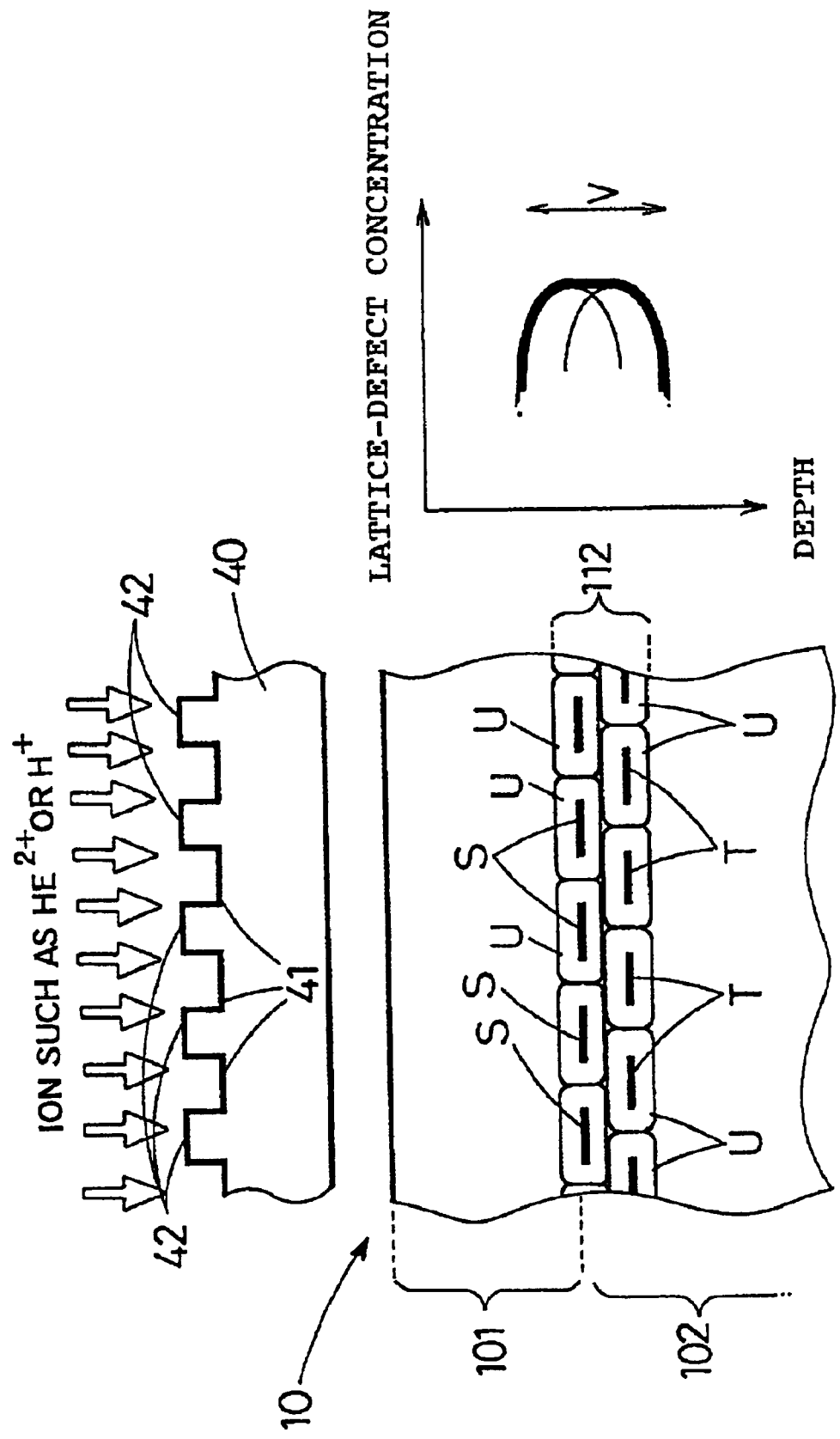
FIG. 13 is a diagram used for explaining radiation of ions for creating a defect region.

Next, the defect region 112 is created by radiation of ions. Ions are radiated to the back surface of the semiconductor layers 10, that is, the p+ substrate 101, through an absorber 40 which is prepared in advance as shown in FIG. 13. It should be noted that the diagram shown in FIG. 13 is obtained by turning the semiconductor layers 10 shown in FIG. 12 and other figures upside down. Ions that can be used in the radiation include helium ions ($He^{2+}$) and hydrogen ions ($H^+$). The absorber 40 is a foil made of a material such as aluminum having grooves 41 and protrusions 42 formed alternately on the upper surface thereof as shown in FIG. 13. The width of each of the grooves 41 and the protrusions 42 is made about the same as the half-value width of the lattice-defect distribution in the semiconductor layers 10 resulting from the radiation of ions. In addition, the difference in thickness of the absorber 40 between a part where the groove 41 is formed and another part where the protrusion 42 is formed is also set at a value about equal to the half-value width of the lattice-defect distribution in the semiconductor layers 10.

The radiation of ions through the absorber 40 described above results in lattice defects created in the semiconductor layers 10 with distribution comprising S-segment groups, T-segments groups and rectangular shapes U each enclosing an S-segment group or a T-segment group as shown in FIG. 13. The S-segment group indicates the location of a distribution peak corresponding to a protrusion 42 of the absorber 40 and the T-segment group indicates the location of a distribution peak corresponding to a groove 41. The difference in location in the depth direction between the S-segment groups and the T-segment groups represents the difference in depth or height between the grooves 41 and the protrusions 42. Each of the rectangular shapes U enclosing an S or T-segment group represents an area with a concentration of distributed lattice defects equal to or greater than half the peak value. The actual resultant distribution in the semiconductor layers 10 is superposition of the distributions represented by the S and T-segment groups. The actual resultant distribution is represented by a thick-line graph shown in FIG. 13. As shown by the graph in the figure, the actual resultant distribution is a distribution in the depth direction having a half-value width V twice that of the half-value width of a stand-alone distribution which has a value of about 10 microns obtained by radiation of $He^{2+}$ ions at an energy of about 24 MeV. As shown in the figure, the distribution of lattice defects in the depth (transversal) direction is all but uniform.

Figure 14:
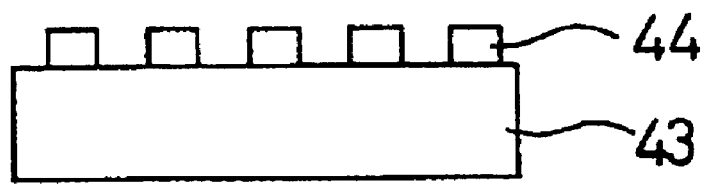
FIG. 14 is a diagram showing another example of the shape of an absorber.

Later on, lattice defects are stabilized by an annealing process at a temperature in the range 200 to 470 degrees Celsius. In this way, the defect region 112 including the non-depletion region 102b of the n drift region 102d is obtained by one-time radiation of ions. It should be noted that, in place of the absorber 40 shown in FIG. 13, it is also possible to use a split absorber assembly comprising a peak-depth adjusting absorber 43 and a half-value width adjusting absorber 44 like the one shown in FIG. 14. With such a split absorber assembly, absorbers of a smaller total number of absorber types can keep up with a variety of combinations of peak depths and half-value widths.

Creation of the Drain Electrode

Finally, the drain electrode 111 is created by piling a metal such as aluminum using a sputtering method on the back surface (the p⁺ substrate 101) of the semiconductor layers 10. The creation of the IGBT 1 is completed by attaching the terminals SC, G and DE to the electrodes 110, 104 and 111 respectively.

Thickness of the Defect Region

Next, necessary thickness of the defect region 112 is explained.

Figure 15:
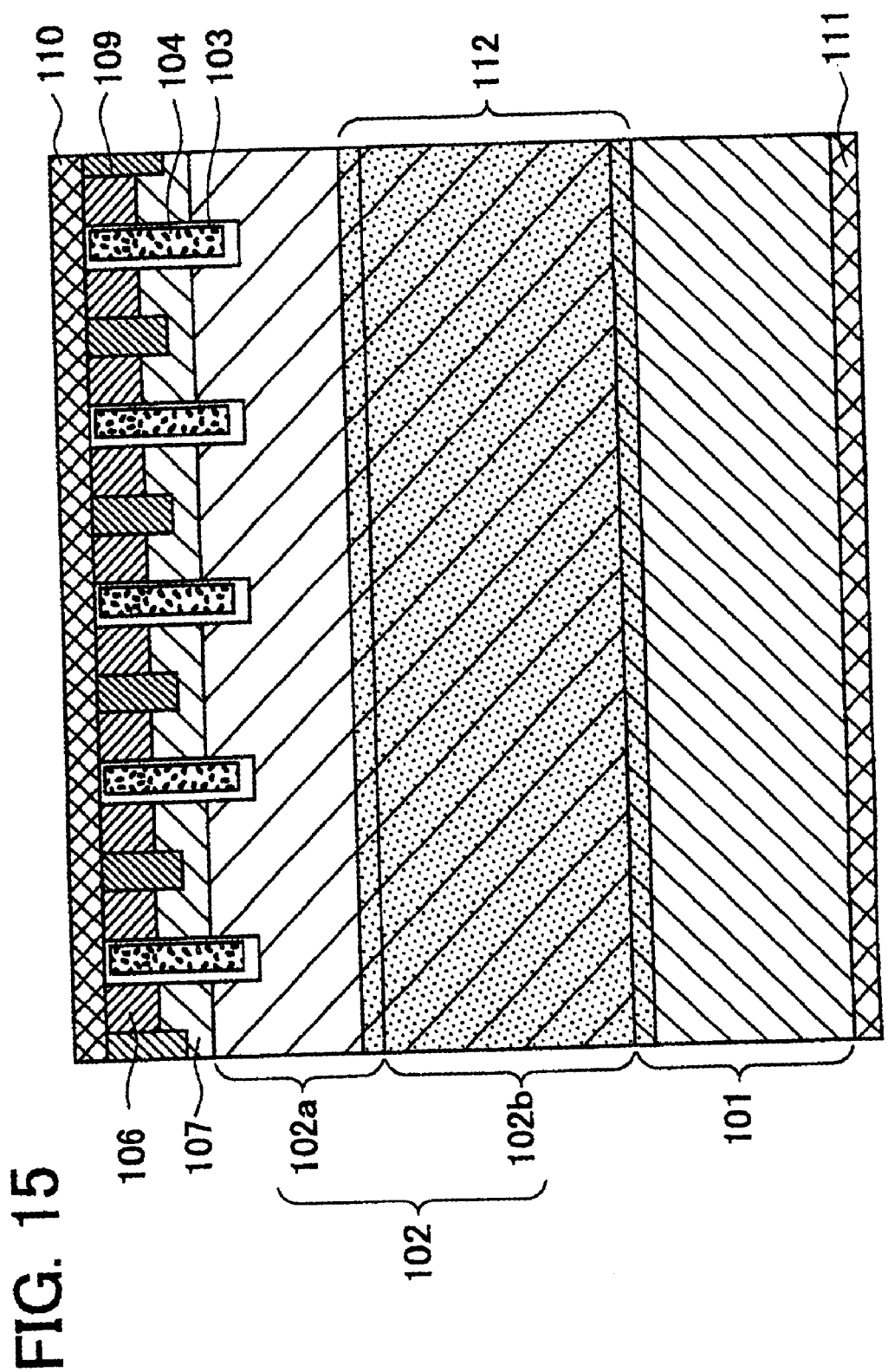
FIG. 15 is a diagram for explaining a necessary thickness of a defect region.

First, a case wherein the concentration of impurities of the n epitaxial layer 102 is $1\times10^{14}$ cm$^{-3}$, the thickness of the n epitaxial layer 102 is 130 μm, and the voltage to be switched is 200V is explained. In this case, as shown in FIG. 15, a depletion region 102a is spread from the pn junction, and the thickness of it reaches to about 50 μm. So, the thickness of the non-depletion region 102b remaining is about 80 μm. And, the defect region 112 must cover this non-depletion region 102b. For this reason, the defect region 112 must be thicker than 80 μm.

Figure 16:
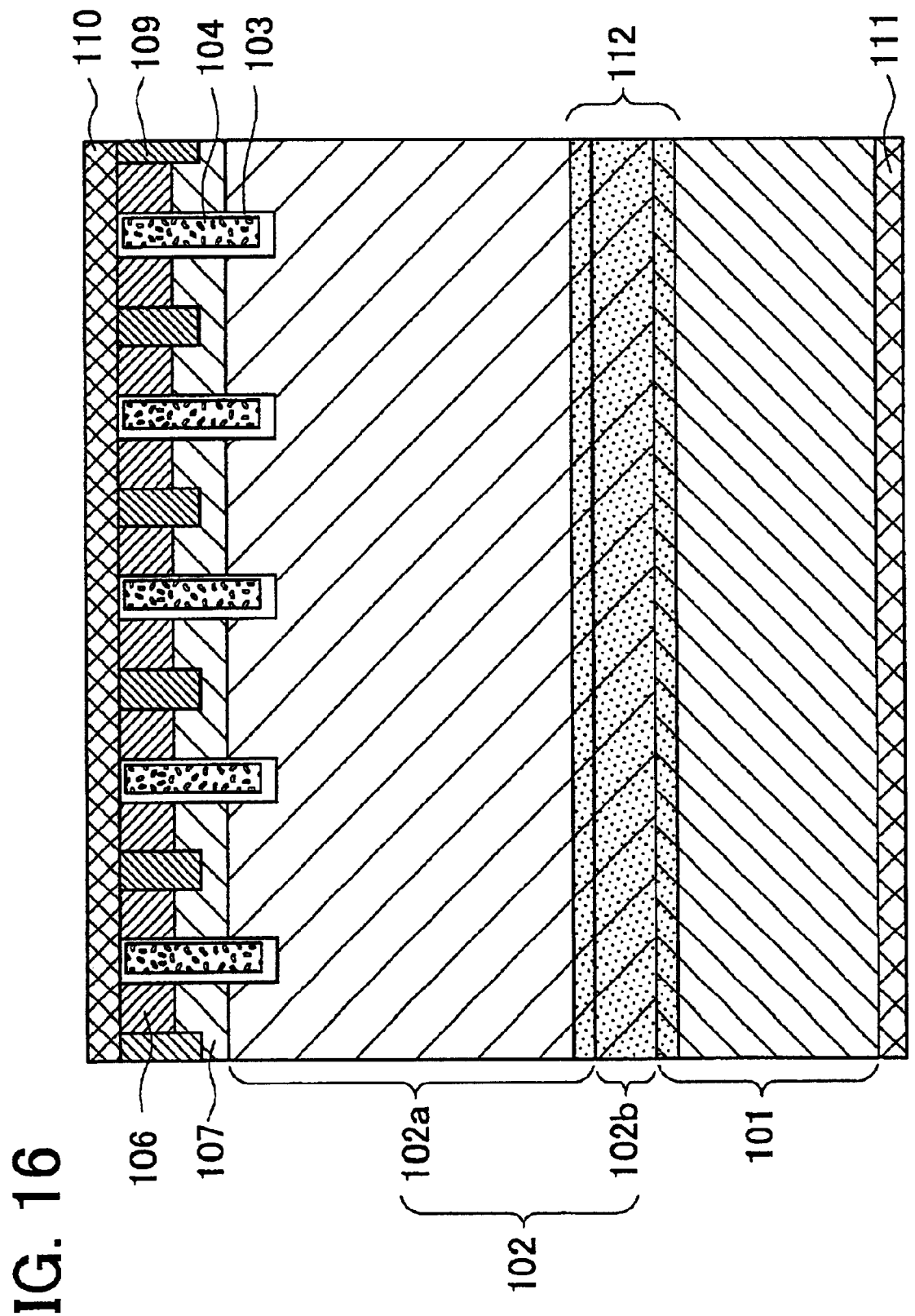
FIG. 16 is a diagram for explaining a necessary thickness of a defect region.

Next, a case wherein the concentration of impurities of the n epitaxial layer 102 is $1\times10^{14}$ cm$^{-3}$, the thickness of the n epitaxial layer 102 is 130 μm, and the voltage to be switched is 1000V is explained. In this case, as shown in FIG. 16, a depletion region 102a is spread from the pn junction, and the thickness of it reaches to about 110 μm. So, the thickness of the non-depletion region 102b remaining is about 20 μm. And, the defect region 112 must cover this non-depletion region 102b. For this reason, the defect region 112 must be thicker than 20 μm.

Figure 17:
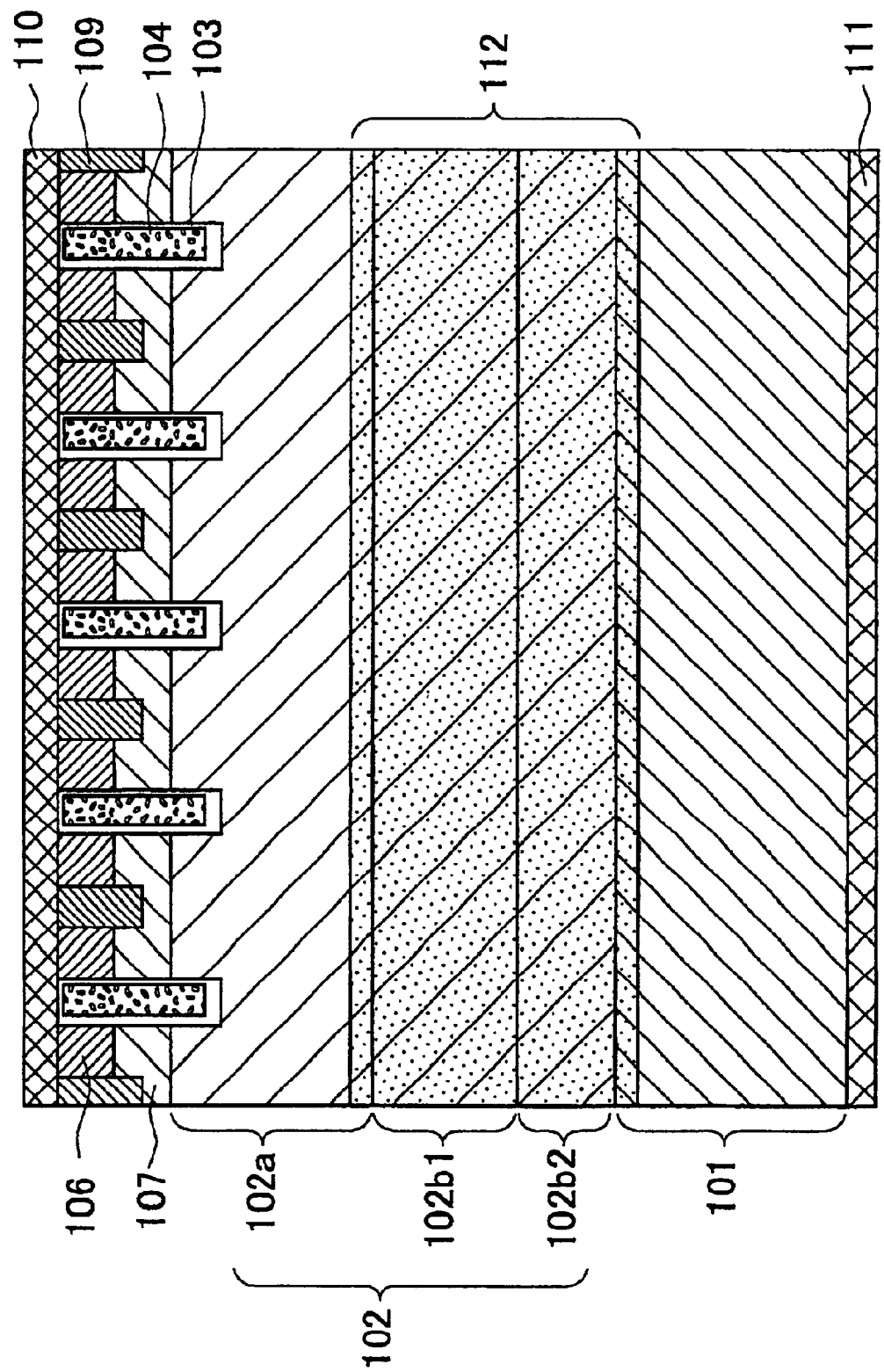
FIG. 17 is a diagram for explaining a necessary thickness of a defect region.

Next, a case wherein a part of n epitaxial layer 102 adjacent to the p⁺ substrate 101 has a higher concentration of impurities than that of other part, the concentration of impurities of the part 102b2 is $1\times10^{18}$ cm$^{-3}$, the thickness of the 102b2 part is 15 μm, the concentration of impurities of the other part of the n epitaxial layer 102 is $1\times10^{14}$ cm$^{-3}$, the thickness of the other part is 80 μm, and the voltage to be switched is 200V is explained. In this case, as shown in FIG. 17, a depletion region 102a is spread from the pn junction, and the thickness of it reaches to about 50 μm. So, the thickness of the non-depletion region 102b1 remaining in the low concentration part is about 30 μm. And also, the part 102b2 remains as a non-depletion region. And, the defect region 112 must cover these non-depletion regions 102b1 and 102b2. For this reason, the defect region 112 must be thicker than 45 μm.

Figure 18:
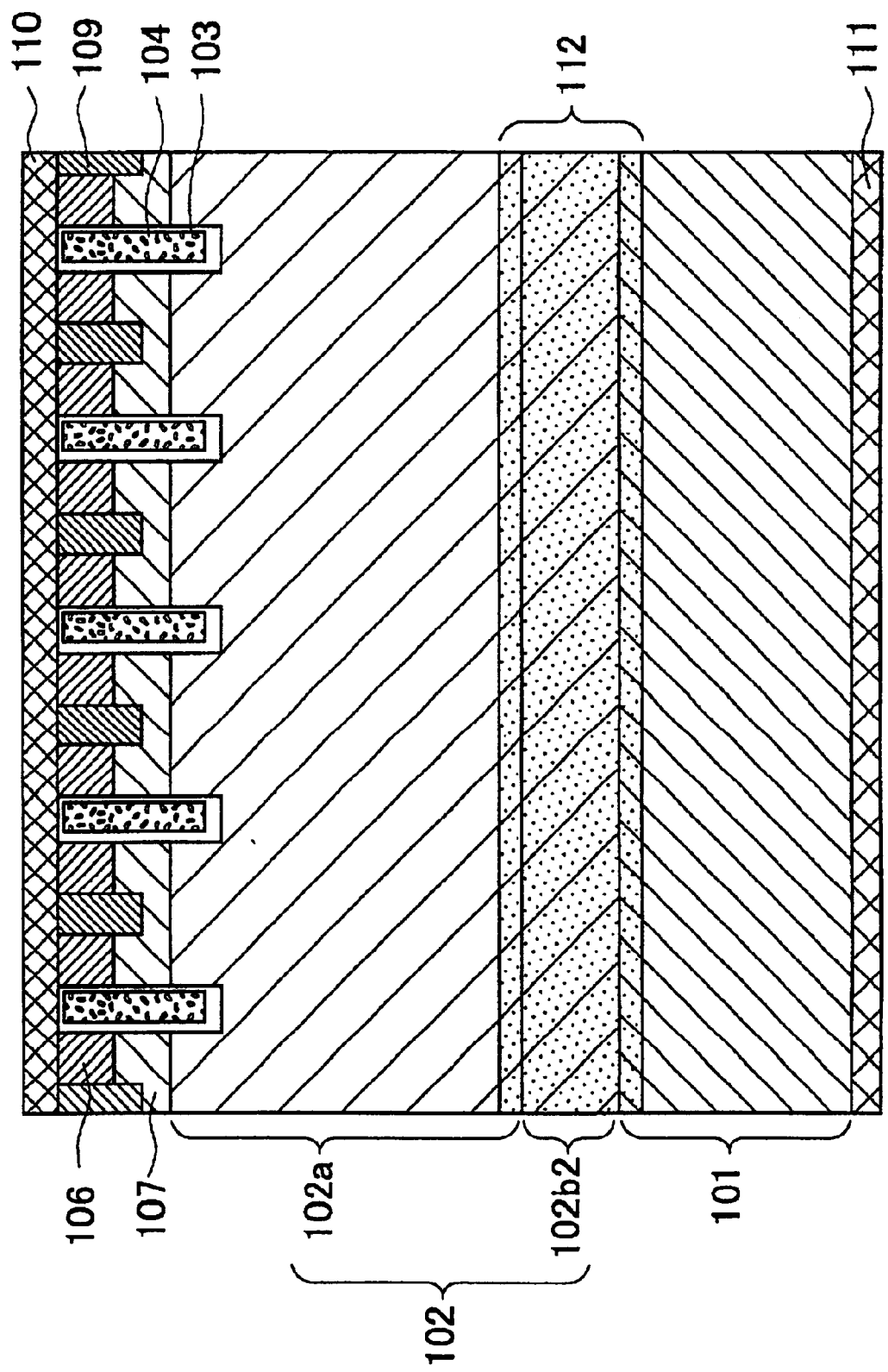
FIG. 18 is a diagram for explaining a necessary thickness of a defect region.
Figure 19:
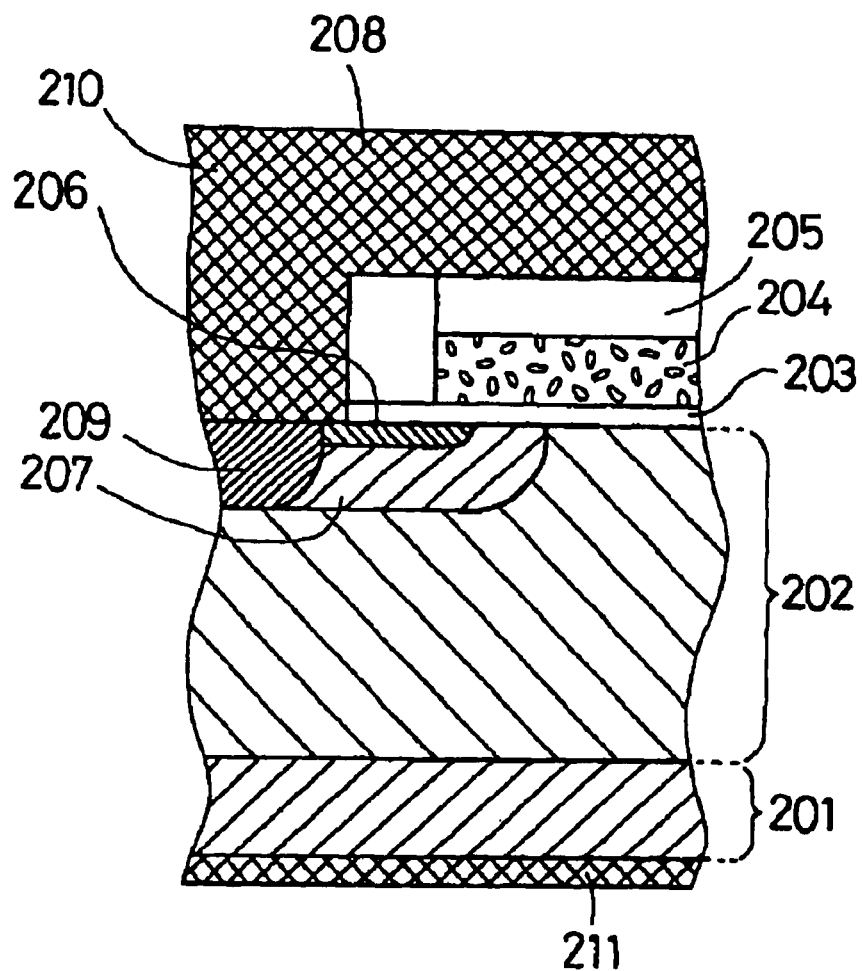
FIG. 19 is a diagram used for explaining the general structure of an IGBT.
Figure 20:
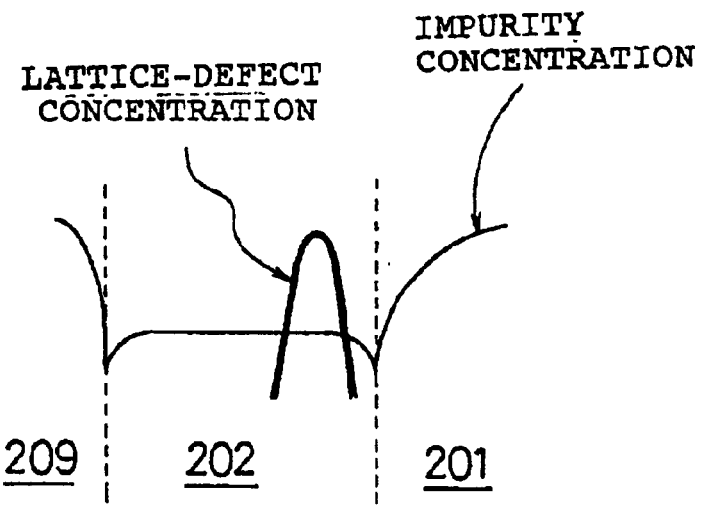
FIG. 20 is a diagram showing a distribution of concentration of lattice defects and impurities in a conventional semiconductor device.
Figure 21:
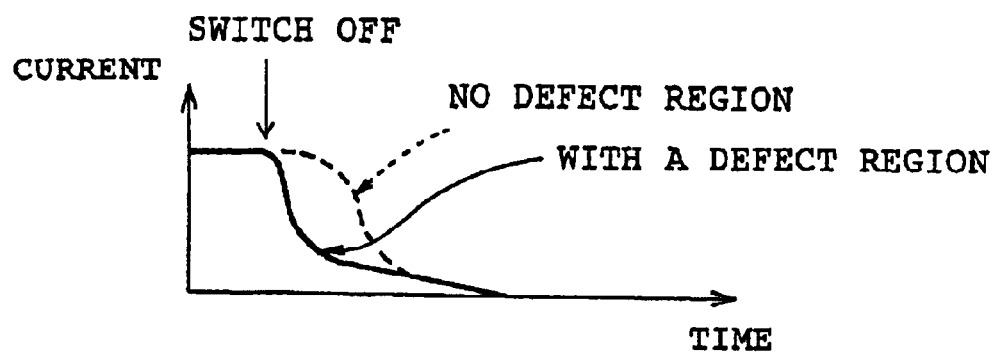
FIG. 21 is a graph showing the transient characteristic of the conventional semiconductor device after a switch-off operation.

Finally, a case wherein a part of n epitaxial layer 102 adjacent to the p⁺ substrate 101 has a higher concentration of impurities than that of other part, the concentration of impurities of the part 102b2 is $1\times10^{18}$ cm$^{-3}$, the thickness of the 102b2 part is 15 μm, the concentration of impurities of the other part of the n epitaxial layer 102 is $1\times10^{14}$ cm$^{-3}$, the thickness of the other part is 80 μm, and the voltage to be switched is 1000V is explained. In this case, as shown in FIG. 18, a depletion region 102a is spread from the pn junction, and the thickness of it reaches to 80 μm. That is, whole of the low concentration part is depleted. So, the thickness of the non-depletion region 102b2 remaining is 15 μm. And, the defect region 112 must cover this non-depletion region 102b2. For this reason, the defect region 112 must be thicker than 15 μm.

As described above in detail, in the IGBT 1 implemented by the embodiment, lattice defects are distributed in an area in close proximity to a boundary surface between the n drift region 102d (the n epitaxial layer 102) and the p⁺ substrate 101 at a high concentration and the half-value width of the distribution thereof is set at a large value so that the non-depletion region 102b of the n drift region 102d, which is not depleted after a switch-off operation, is included in the defect region 112. As a result, when the gate voltage is switched off, carriers in the entire n drift region 102d are extinguished fast, causing a current flowing from the drain electrode 111 to the source electrode 110 after the switch-off operation to converge to zero in a short period of time. That is to say, the IGBT 1 implemented by the embodiment has a short turning-off time, exhibiting an excellent turning-off response.

In addition, while the half-value width of the distribution thereof is set at a large value so that the non-depletion region 102b of the n drift region 102d, which is not depleted after a switch-off operation, is included in the defect region 112, the defect region 112 is not spread to the diffusion layers such as the p body region 107. As a result, the turned-on resistance does not increase in particular. That is to say, by setting the position and the width of the defect region 112 at such a location and such a value that cause the defect region 112 to include the non-depletion region 102b but not to be spread to the diffusion layers as described above, the turning-off time can be reduced substantially and, at the same time, the turned-on resistance can be prevented effectively from increasing.

Moreover, since the half-value width of the distribution of the lattice defects is set at a sufficiently large value, there is all but no case in which the non-depletion region 102b protrudes to an area outside the defect region 112 even if the position in the depth direction of the created defect region 112 varies to a certain degree due to causes in manufacturing processes. As a result, the IGBT 1 implemented by this embodiment has a merit that a stable effect of reduction of the turning-off time can be obtained.

In addition, since the defect region 112 is created during the process of manufacturing the IGBT 1 by radiation of ions through the absorber 40 which has the grooves 41 and the protrusions 42 with the depths and heights thereof varying from place to place, a defect region 112 with a desired peak depth and a desired width can be created by one-time radiation of ions. As a result, it is not necessary to carry out ion radiation several times by changing the energy of the ion and the type of the absorber, making the manufacturing process simple and preventing the manufacturing cost from increasing considerably. In addition, since the half-value width of the defect distribution increases by an amount corresponding to differences in depth or height of the grooves 41 and the protrusions 42, a defect region 112 with a required width can be obtained without consuming excessively high acceleration energy.

It should be noted that while the present invention has been explained with reference to a preferred embodiment, the explanation is not to be construed in a limiting sense. It is to be understood by those skilled in the art that a variety of improvements and modifications can of course be made to the embodiment without departing from the true spirit and the scope of the present invention.

For example, in the IGBT 1 implemented by the embodiment, there is not provided in particular a difference in impurity concentration in the n drift region 102d. It should be noted, however, that it is also conceivable to provide some concentration distribution in the n drift region 102d. Normally, a buffer layer with a high concentration can be provided in the n drift region 102d, particularly in the non-depletion region 102b. In some cases, the entire non-depletion region 102b can be made a buffer layer. In addition, the IGBT 1 is a so-called planar semiconductor device. However, the present invention can also be applied to a semiconductor device with a particular gate structure such as a semiconductor device of a trench-gate type. In addition, it is not absolutely necessary to use an insulated gate. That is to say, the scope of the present invention also includes a semiconductor device of an electric-conductivity modulation type employing no insulated gate. Moreover, the present invention can also be applied to a semiconductor device with a reversed polarity of the pn junction thereof in comparison with the pn-junction polarity in the IGBT 1.

There are also some conceivable changes that can be made to the processing method described above. For example, in the embodiment described above, the defect region 112 is created after the creation of the diffusion layers such as the p body region 107. It should be noted, however, that the defect region 112 can also be created before the creation of the diffusion layers. In addition, instead of radiating ions from the back-surface side of the semiconductor layers 10 for creating the defect region 112, ions can be radiated from the front-surface side. It is worth noting that, if ions are radiated from the front-surface side, an effect of the passing of the radiated ions through components such as the diffusion layers is a cause of concern. Normally, however, an annealing process is carried out after the radiation for stabilization purposes. At that time, the effect of the passing of the radiated ions through components is eliminated. Thus, if ions are radiated under a condition that the radiated ions are not stopped in components such as the diffusion layers, there will be no such a problem.

Furthermore, the manufacturing method can be applied to a semiconductor device having a new structure other than that described above as long as the semiconductor device is a switching device.

In addition, in the process of radiating ions, in place of the absorber 40 prepared in advance, a thin film can be created from the same material as the absorber with an uneven shape. In this case, it is conceivable to use the thin film later as an electrode.

As described above, according to the present invention, distribution of lattice defects with a proper peak depth and a proper width can be implemented in the semiconductor layers, making it possible to implement a semiconductor device having a sufficiently reduced turning-off time without an accompanying increase in turned-on resistance as well as a method for manufacturing the semiconductor device.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   a semiconductor layer;
   a switching element provided on a surface of the semiconductor layer;
   a substrate at another surface of the semiconductor layer and having an opposite conductivity type of the semiconductor layer, a portion of the semiconductor layer located between the switching element and the substrate having an impurity concentration sufficient enough so that a region adjacent to the substrate is not depleted;
   a defect region provided in a portion of said semiconductor layer that includes an entire non depletion layer and at least a portion of said substrate, wherein the non-depletion layer is not depleted after a switch-off operation, and a half-valued width of a lattice defect concentration of the defect region is thicker than the thickness of the non-depletion layer;
   a peak of lattice defect concentration being within said non-depletion layer, wherein said lattice defect concentration in the non-depletion layer is sufficient to shorten lifetime of carriers and reduce turn-off time; and
   a switching control having a current flowing in a thickness direction of the semiconductor layer when said switching element is turned on and off.

2. A semiconductor device according to claim 1 wherein said defect region does not include said switching element.

3. A semiconductor device according to claim 1 wherein the life times of carriers in said defect region are shorter than those in other portions.

4. A semiconductor device according to claim 1 comprising a bipolar transistor with an emitter, a base and a collector thereof laid out in the thickness direction of said semiconductor layer,
   wherein said switching element is a field-effect transistor which is turned on for injecting carriers to said base of said bipolar transistor.

5. A semiconductor device according to claim 2 comprising a bipolar transistor with an emitter, a base and a collector thereof laid out in the thickness direction of said semiconductor layer wherein said switching element is a field-effect transistor which is turned on for injecting carriers to said base of said bipolar transistor.

6. A semiconductor device according to claim 4 wherein said defect region includes an entire portion in said base in close proximity to said emitter which is not depleted after a switch-off operation.

7. A semiconductor device according to claim 5 wherein said defect region includes an entire portion in said base in close proximity to said emitter which is not depleted after a switch-off operation.

8. A semiconductor device according to claim 4 wherein said bipolar transistor and said field-effect transistor constitute an insulated-gate bipolar transistor (IGBT).

9. A semiconductor device according to claim 5 wherein said bipolar transistor and said field-effect transistor constitute an insulated-gate bipolar transistor (IGBT).

10. A semiconductor device according to claim 6 wherein said bipolar transistor and said field-effect transistor constitute an insulated-gate bipolar transistor (IGBT).

11. A semiconductor device according to claim 7 wherein said bipolar transistor and said field-effect transistor constitute an insulated-gate bipolar transistor (IGBT).

* * * * *